United States Patent [19]

Drye et al.

[11] Patent Number: 4,792,533

[45] Date of Patent: Dec. 20, 1988

[54] COPLANAR DIE TO SUBSTRATE BOND METHOD

[75] Inventors: James E. Drye, Mesa; Steven L. Post, Tempe, both of Ariz.

[73] Assignee: Motorola Inc., Schaumburg, Ill.

[21] Appl. No.: 25,687

[22] Filed: Mar. 13, 1987

[51] Int. Cl.$^4$ .................. H01L 21/56; H01L 21/60
[52] U.S. Cl. .................. 437/213; 437/235; 357/81
[58] Field of Search ............ 437/209, 212, 213, 235

[56] References Cited

U.S. PATENT DOCUMENTS

| | | | |
|---|---|---|---|
| 3,909,332 | 9/1975 | Yerman | 437/209 |
| 4,017,886 | 4/1977 | Tomono et al. | 427/209 |
| 4,630,096 | 12/1986 | Drye et al. | 357/81 |
| 4,722,914 | 2/1988 | Drye et al. | 437/213 |

FOREIGN PATENT DOCUMENTS

| | | | |
|---|---|---|---|
| 0074288 | 6/1977 | Japan | 437/235 |
| 0033065 | 3/1978 | Japan | 437/213 |

Primary Examiner—Donald L. Walton
Attorney, Agent, or Firm—Harry A. Wolin

[57] ABSTRACT

A method for bonding die to substrates coplanarly in a multichip module assembly. After the die are aligned into die openings of the substrate, a glass slurry is applied and the module is fired to solidify the glass. Because of shrinkage of the glass slurry firing, a groove results between the die and the substrate. To fill on this groove, a polyimide or like film is adhered and then pressed and cured on the surface of the die and substrate. This film is used as a base for interconnect lines.

14 Claims, 1 Drawing Sheet

COPLANAR DIE TO SUBSTRATE BOND METHOD

BACKGROUND OF THE INVENTION

This invention generally pertains to a coplanar die to substrate bond method. Generally, in high density integrated circuit module assemblies and the like, it is desirable to have a coplanar relationship between the plurality of die and the substrate in which the die are mounted so that future processing steps may be performed with relative ease. U.S. Pat. No. 4,630,096 entitled "High Density IC Module Assembly" which was issued on Dec. 16, 1986 is the type of module in which the present invention will be used.

Previous die to substrate bond methods have met difficulty in that there is a lack of coplanarity between the die and the substrate. The die are generally bonded to the substrate using a glass slurry. Perhaps the most common problem occurs due to the firing of the glass after it has been applied to the die and substrate. While the glass is being fired, it shrinks, thereby creating grooves between the substrate and the die. This lack of coplanarity creates shorting of interconnect lines and step coverage problems due to improper amounts of metal interconnect being disposed in the existing groove. Therefore, a coplanar die to substrate bonding method which allows easier interconnect line processing steps is highly desirable.

SUMMARY OF THE INVENTION

The present invention pertains to a coplanar die to substrate bond method. When using this method, a plurality of die are aligned so that they may be disposed in predetermined die openings in a silicon wafer substrate. Once these die are aligned, a glass slurry is applied so that a bond may be formed between the die and the substrate. After excess glass slurry is cleaned from both the die and the substrate, the module is fired until the glass becomes solid. Commonly, during this firing, the glass shrinks and grooves are formed between the die and the substrate. The elimination of this groove is essential in order to obtain coplanarity on the face of the module. To do this, the applying and firing of the glass slurry may be done more than once. Also, to further reduce the groove, a polyimide adhesive is spun onto the face of the die and substrate and a polyimide film layer will further be disposed on the adhesive. This adhesive and polyimide film layer are pressed and cured thereby covering in the unwanted grooves.

It is an object of the present invention to provide a new and improved coplanar die to substrate bond method.

It is a further object of the present invention to provide a new and improved coplanar die to substrate bond method which will enable further processing steps to be performed more easily.

It is a further object of the present invention to provide a new and improved coplanar die to substrate bond method which enables a high density integrated circuit module assembly to be cheaply and easily manufactured.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
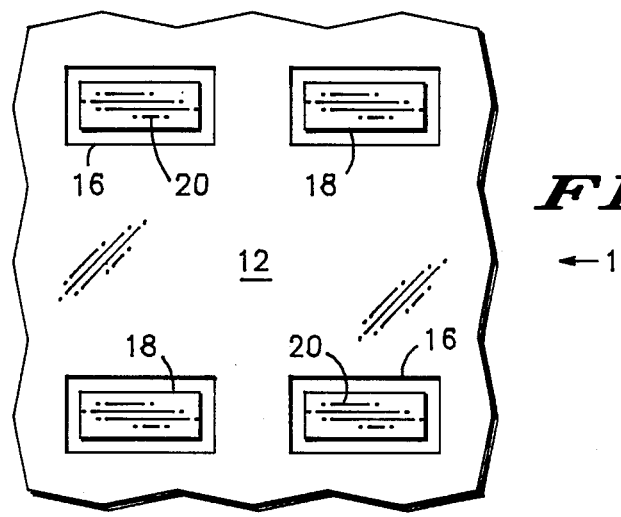
FIG. 1 is a highly enlarged top view of a section of a silicon wafer of the type which will embody the present invention.
Figure 2:
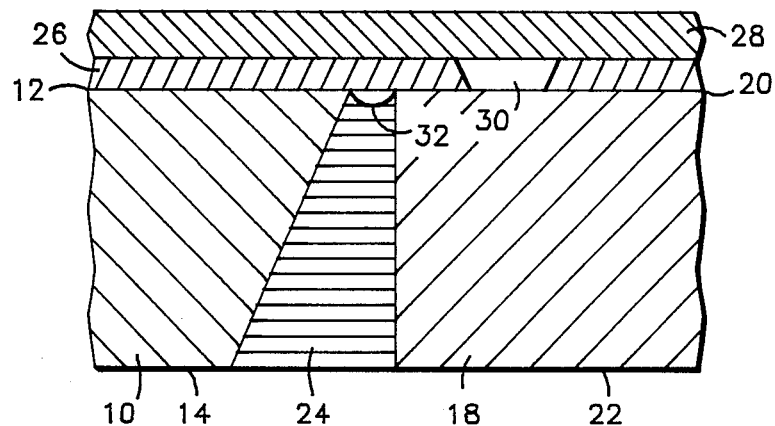
FIG. 2 is a highly enlarged cross sectional view of a die bonded to a silicon wafer substrate embodying the present invention.

Referring specifically to FIG. 1, a highly enlarged top view of a section of a silicon wafer substrate, designated 10, and FIG. 2, a highly enlarged cross-sectional view of a die bonded to silicon wafer substrate 10 are shown. Silicon wafer 10 has a first surface, 12, and a second surface, 14. Further, silicon wafer 10 includes a plurality of die openings, 16, which are formed in silicon wafer 10 by etching or other methods well known in the art. Each member of a plurality of die, 18, includes a first surface, 20, and a second surface, 22. Members of plurality of die 18 are disposed throughout silicon wafer 10 in die openings 16. Plurality of die 18 are disposed in die openings 16 of silicon wafer 10 so that first surfaces 20 of plurality of die 18 face in the same direction as first surface 12 of silicon wafer 10 and substantially lie in a common plane. Respectively, second surface 22 of plurality of die 18 face in the same direction as second surface 14 of silicon wafer 10. Plurality of die 18 are disposed and aligned on a vacuum plate which is specially designed so that silicon wafer 10 also may be aligned with respect to plurality of die 18 on the same vacuum plate thereby allowing for a predetermined relationship between silicon wafer 10 and plurality of die 18.

Once plurality of die 18 are disposed and aligned in the predetermined relationship with respect to silicon wafer 10, a slurry of glass, 24, is applied to silicon wafer 10 and plurality of die 18 so as to bond them together. Once glass 24 is applied in slurry form, silicon wafer 10 and plurality of die 18 remain on the vacuum plate until glass 24 hardens slightly. Then silicon wafer 10 and plurality of die 18 are removed and excess glass 24 is cleaned from both the first surface 12 and second surface 14 of silicon wafer 10 as well as first surface 20 and second surface 22 of plurality of die 18. Once this cleaning has been accomplished, silicon wafer 10 and plurality of die 18 are fired so that glass 24 will melt and form a solid bond between silicon wafer 10 and die 18. The temperature at which the firing takes place is determined by the type of glass 24 which is used. Commonly, CF6 Nippon Electric Glass with a 15% $SiO_2$ filler is used. A predetermined amount of terpineol is used so that the glass may be applied in slurry form. Because glass 24 will have a certain amount of shrinkage when fired it is possible that the process of applying the glass slurry, cleaning and firing be performed more than once.

Following the firing of silicon wafer 10, plurality of die 18 and glass 24, a small groove 32, may still exist due to the shrinkage of glass 24 during firing. Groove 32 will cause many problems in future processing steps some of these problems being step coverage and the shorting of interconnect lines. In order that these problems do not occur, it is desirable to eliminate groove 32 so that first surface 12 of silicon wafer 10 and first surfaces 20 of plurality of die 18 as well as areas in between them are coplanar. The coplanarity is achieved by applying a polyimide or like film to first surface 12 of silicon wafer 10 and first surfaces 20 of plurality of die 18.

Initially, a polyimide adhesive layer, 26, is spun on to first surface 12 of silicon wafer 10 and first surfaces 20 of die 18. Adhesive layer 26 is commonly between 0.5 and 5 microns. 2555 made by the Dupont Company is used as an adhesive for this application. Additionally, it might be desirable to pre-pattern adhesive layer 26 in desired areas so that future processing steps may be more easily performed. A via 30 is shown to have been prepatterned in FIG. 2. It is desirable to pre-pattern in predetermined areas such as the contact pads of die 18 to make them more easily accessible for future processing steps. For example, if via 30 is above a bonding area of die 18, the pre-patterning eliminates the need for patterning this area in the future. Once adhesive layer 26 has been applied to silicon wafer 10 and plurality of die 18, a polyimide film layer, 28, is applied over adhesive layer 26. Commonly film layer 28 may be of a film such as Kapton which is made by the Dupont Company. Additionally, film layer 28 is commonly between 8.0 and 24.0 microns thick. Once film layer 28 has been disposed on adhesive layer 26, it must be pressed and cured. When using Kapton film, pressing and curing takes place at a pressure of 1500 to 2000 psi, a temperature of 250 to 350 degrees centigrade and a time of 6 to 10 minutes. These variables may differ depending on the type of film used. Additionally, it should be understood that a film layer 28 initially incorporating an adhesive layer 26 may be used rather than using the previously described two-step process. The addition of film layer 28 and adhesive layer 26 essentially eliminates groove 32 when pressed thereby allowing for future processing steps to be performed with relative ease.

Figure 3:
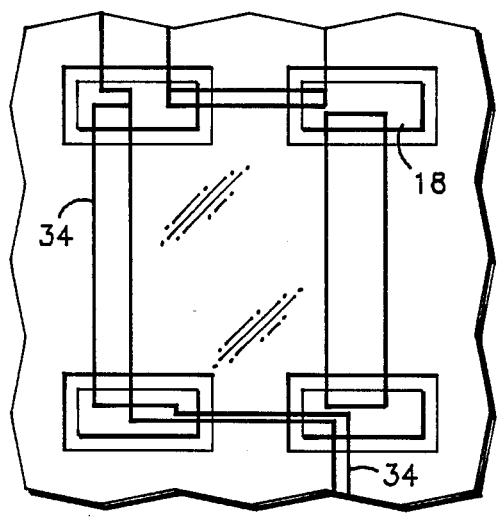
FIG. 3 is a highly enlarged top view of a section of a silicon wafer including plurality of die having interconnect lines processed thereon.

Referring specifically to FIG. 3, a highly enlarged top view of a section of silicon wafer 10 including plurality of die 18 and further having a plurality of interconnect lines, 34, is shown. Once the application of film layer 28 has been completed, the processing of interconnect lines 34 may begin. To do this, film layer 28, adhesive layer 26 and predetermined areas of first surface 12 of silicon wafer 10 as well as first surfaces 20 of die 18 must be patterned and etched so that the interconnect lines 34 may be processed. Any pre-patterned vias 30 will be employed at this stage and will allow for a decreased amount of patterning and etching. Because film layer 28 and adhesive layer 26 have been applied, interconnect lines 34 may be processed on a module having greatly increased planarity.

Thus it is apparent that there has been provided, in accordance with the invention, an improved coplanar die to substrate bond method which meets the objects and advantages set forth above. While we have shown and described specific embodiments of this invention, further modifications and improvements will occur to those skilled in the art. We desire to be understood, therefore, that this invention is not limited to the particular form shown and we intend in the appended claims to cover all modifications which do not depart from the spirit and scope of this invention.

What is claimed is:

1. A method for achieving coplanarity in bonding die to substrates in multichip modules comprising the steps of:
   providing a silicon wafer having a first surface and a second surface;
   etching die openings into said silicon wafer;
   providing a plurality of die, each having a first surface and a second surface, said plurality of die to be bonded to said silicon wafer;
   disposing and aligning said plurality of die in said die openings of said silicon wafer so that said first surface of said silicon wafer and said first surfaces of each member of said plurality of die face in the same direction and lie in a common plane;
   applying a glass slurry to said silicon wafer and said plurality of die so that said glass slurry penetrates between each member of said plurality of die and said silicon wafer;
   firing said silicon wafer including said plurality of die and said glass slurry until said glass slurry becomes solid;
   adhering and pressing a polyimide film to said first surface of said silicon wafer including said plurality of die; and
   curing said film.

2. The method of claim 1 wherein the applying a glass slurry and firing steps may be performed more than once.

3. The method of claim 1 wherein the adhering and pressing step includes using a film having an adhesive material incorporated thereto.

4. The method of claim 1 wherein the adhering and pressing step further includes the steps of:
   spinning a polyimide adhesive onto the first surfaces of the silicon wafer and the plurality of die; and
   applying a layer of polyimide film to said adhesive on said first surface of said silicon wafer.

5. The method of claim 4 wherein the polyimide adhesive has a thickness in the range of 0.5 to 5.0 microns.

6. The method of claim 4 wherein the polyimide film layer has a thickness in the range of 8.0 to 24.0 microns.

7. The method of claim 4 wherein the polyimide film layer is pressed and cured at a pressure in the range of 1500 to 2000 psi, a temperature in the range of 250 to 350 degrees centigrade and for a time in the range of 6 to 10 minutes.

8. The method of claim 4 further comprising the step of pre-patterning by etching the polyimide adhesive so as to leave exposed portions of the first surfaces of the plurality of die.

9. A method for achieving coplanarity in bonding die to substrates in multichip modules comprising the steps of:
   providing a silicon wafer having a first surface and a second surface;
   etching die openings into said silicon wafer;
   providing a plurality of die, each having a first surface and a second surface, said plurality of die to be bonded to said silicon wafer;
   disposing and aligning said plurality of die in said die openings of said silicon wafer so that said first surface of said silicon wafer and said first surfaces of each member of said plurality of die face in the same direction and lie in a common plane;
   applying a glass slurry to said silicon wafer and said plurality of die so that said glass slurry penetrates between each member of said plurality of die and said silicon wafer;
cleaning the excess of said glass slurry from said silicon wafer including said plurality of die so that said first and said second surfaces of said silicon wafer and said plurality of die do not have said glass slurry on them;
firing said silicon wafer including said plurality of die and said glass slurry until said glass becomes solid;
spinning a polyimide adhesive onto said first surfaces of said silicon wafer and said plurality of die;
pre-patterning by etching said polyimide adhesive so as to leave exposed portions of said first surfaces of said plurality of die;
disposing a polyimide film layer to said adhesive on said first surface of said silicon wafer;
pressing and curing said polyimide film;
patterning and etching said film layer, said adhesive layer, said first surface of said silicon wafer and said first surfaces of said plurality of die in predetermined areas; and
processing a plurality of metal interconnect lines.

10. The method of claim 9 wherein the applying a glass slurry, cleaning and firing steps may be performed more than once.

11. The method of claim 9 wherein the adhesive is incorporated onto the film.

12. The method of claim 9 wherein the polyimide adhesive has a thickness in the range of 0.5 to 5.0 microns.

13. The method of claim 9 wherein the polyimide film layer has a thickness in the range of 8.0 to 24.0 microns.

14. The method of claim 9 wherein the polyimide film layer is pressed and cured at a pressure in the range of 1500 to 2000 psi, a temperature in the range of 250 to 350 degrees centigrade and for a time in the range of 6 to 10 minutes.

* * * * *